(12) United States Patent
Xu et al.

(10) Patent No.: US 10,181,821 B2
(45) Date of Patent: Jan. 15, 2019

(54) FREQUENCY-COMPENSATED TRANSCONDUCTANCE AMPLIFIER

(71) Applicant: China Electronic Technology Corporation, 24th Research Institute, Chongqing (CN)

(72) Inventors: Daiguo Xu, Chongqing (CN); Gangyi Hu, Chongqing (CN); Ruzhang Li, Chongqing (CN); Jian'an Wang, Chongqing (CN); Guangbing Chen, Chongqing (CN); Yuxin Wang, Chongqing (CN); Tao Liu, Chongqing (CN); Lu Liu, Chongqing (CN); Minming Deng, Chongqing (CN); Hanfu Shi, Chongqing (CN); Xu Wang, Chongqing (CN)

(73) Assignee: CHINA ELECTRONIC TECHNOLOGY CORPORATION 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 15/555,543

(22) PCT Filed: Jan. 26, 2016

(86) PCT No.: PCT/CN2016/072165
§ 371 (c)(1),
(2) Date: Sep. 4, 2017

(87) PCT Pub. No.: WO2017/124575
PCT Pub. Date: Jul. 27, 2017

(65) Prior Publication Data
US 2018/0054168 A1    Feb. 22, 2018

(30) Foreign Application Priority Data

Jan. 21, 2016 (CN) .......................... 2016 1 0040162

(51) Int. Cl.
*H03F 3/45* (2006.01)
*H03F 1/14* (2006.01)

(52) U.S. Cl.
CPC ............ *H03F 1/14* (2013.01); *H03F 3/4521* (2013.01); *H03F 3/45183* (2013.01);
(Continued)

(58) Field of Classification Search
CPC ....................................................... H03F 3/45
(Continued)

(56) References Cited

U.S. PATENT DOCUMENTS 6,531,921 B2 * 3/2003 Horie ................. H03F 3/45192
330/255
7,248,117 B1 * 7/2007 Li ........................... H03F 1/086
330/260
(Continued)

FOREIGN PATENT DOCUMENTS

CN      101373956 A    2/2009
CN      101917169 A    12/2010
(Continued)

*Primary Examiner* — Henry Choe
(74) *Attorney, Agent, or Firm* — Cheng-Ju Chiang

(57) ABSTRACT

The present invention provides a frequency-compensated transconductance amplifier, includes an input stage consisting of NMOS transistors M1 and M2, a first-stage active load consisting of PMOS transistors M3 and M4, a first-stage tail current source consisting of a constant current source Iss, a second-stage input transistor consisting of a PMOS transistor M5, a second-stage constant current source consisting of an NMOS transistor M6, a load capacitor consisting of a capacitor $C_L$, and a frequency compensation network formed by sequentially connecting a gain stage GAIN, a compensating resistor Rc and a compensating capacitor Cc in series.

6 Claims, 9 Drawing Sheets

(52) U.S. Cl.
CPC ............ *H03F 2203/45288* (2013.01); *H03F 2203/45352* (2013.01); *H03F 2203/45526* (2013.01)

(58) Field of Classification Search
USPC .............................. 330/257, 261, 253, 255
See application file for complete search history.

(56) References Cited

U.S. PATENT DOCUMENTS

| | | | | |
|---|---|---|---|---|
| 7,538,537 B2 * | 5/2009 | Minakuchi | ............ | G05F 1/575 |
| | | | | 323/280 |
| 2011/0187456 A1 | 8/2011 | Huang et al. | | |

FOREIGN PATENT DOCUMENTS

| | | |
|---|---|---|
| CN | 104391533 A | 3/2015 |
| CN | 104820459 A | 8/2015 |

\* cited by examiner

FREQUENCY-COMPENSATED TRANSCONDUCTANCE AMPLIFIER

BACKGROUND OF THE INVENTION

Technical Field

The present invention belongs to the technical field of analog or digital-analog hybrid integrated circuits, and in particular to a frequency-compensated transconductance amplifier.

Description of Related Art

With the continuous development of an integrated circuit design technology in recent years, more and more transconductance amplifiers have been applied to the field of analog integrated circuit designs. In most of the application scenarios of the transconductance amplifier, frequency compensation is performed on the transconductance amplifier in order to allow the transconductance amplifier to obtain a larger phase margin and guarantee the stability of the transconductance amplifier. However, in a traditional frequency compensation technology specific to the transconductance amplifier, an ideal phase margin is typically obtained by reducing a dominant pole in a frequency domain through pole splitting, but the dominant pole reduction results in −3 dB bandwidth reduction, greatly reducing a unity-gain bandwidth of the transconductance amplifier. Or, a larger phase margin is obtained by introducing a left half-plane zero point with a passive frequency compensation technology to undergo cancellation with a first non-dominant pole, but the passive compensation technology may also reduce the frequency of the first non-dominant pole at the same time, and both the zero point of a transmission function and the pole may be affected by a compensating capacitance, resulting in an insignificant zero-pole cancellation effect. Therefore, the traditional compensation technology hardly meets various requirements of a high-performance transconductance amplifier at the same time.

To describe the above technical problems in more details, two types of frequency compensation technologies specific to the transconductance amplifier are first analyzed below in terms of principle as well as advantages and disadvantages.

Referring to a structure 1 as shown in FIG. 1, there is provided a principle diagram of a traditional RC compensation technology for a transconductance amplifier, where a compensation network is formed by connecting a compensating resistor Rc and a compensating capacitor Cc in series, one end of the compensating resistor Rc is connected with the compensating capacitor Cc, the other end of the compensating resistor Rc is connected with a drain of an NMOS transistor M2 and simultaneously connected with a drain of a PMOS transistor M4, with a node here also serving as a grid of a PMOS transistor M5, and the other end of the compensating capacitor Cc is connected with an output end of the transconductance amplifier. Based on studies, the inventor of the present invention has found that this compensation method is an extension of the Miller compensation method and has an effect similar to that of Miller compensation; with this compensation method, a large capacitance is generated at an output end at a first stage of the transconductance amplifier, i.e. at the drain of the NMOS transistor M2 and the drain of the PMOS transistor M4, and a dominant pole of a transmission function of the transconductance amplifier is moved to a low frequency with this compensation effect. Meanwhile, a right half-plane zero point or a left half-plane zero point of a higher frequency, depending on the magnitude of the compensating resistor Rc, is generated in the transmission function of the transconductance amplifier due to the presence of the compensating resistor Rc. The compensation method as shown in the structure 1 has the advantage that a compensation structure is simple so that the transconductance amplifier may obtain an ideal phase margin as long as the compensating resistor Rc and the compensating capacitor Cc are designed reasonably, thereby enhancing the stability of the transconductance amplifier. However, this compensation method has the disadvantage that the transconductance amplifier has a −3 dB width reduction due to the movement of the dominant pole of the transconductance amplifier to a lower frequency, which greatly reduces the unity-gain bandwidth of the transconductance amplifier.

Referring to a structure 2 as shown in FIG. 2, there is provided a principle diagram of a passive frequency compensation technology for a transconductance amplifier, where a compensation network is likewise formed by connecting a compensating resistor Rc and a compensating capacitor Cc in series, and one end of the compensating resistor Rc is connected with the compensating capacitor Cc, and compared with the traditional Miller compensation method, a difference is that the other end of the compensating resistor Rc is connected with a drain of an NMOS transistor M1, with a node here also serving as both a drain and a grid of a PMOS transistor M3 in diode connection, and the other end of the compensating capacitor Cc is connected with a drain of an NMOS transistor M2 and simultaneously connected with a drain of a PMOS transistor M4, with a node here also serving as a grid of a PMOS transistor M5. With the compensation method as shown in the structure 2, a transmission function of the transconductance amplifier can be approximately expressed as follows:

$$\frac{Vout}{Vin} = \frac{g_{m1}g_{m5}R_1R_L(1+sRcCc)}{(1+sR_LC_L)(1+sCc(a+Rc))} \qquad (1)$$

Thereinto, it is particularly noted that $R_1$ represents an output impedance at a first stage of the transconductance amplifier, $R_L$ represents an output impedance at a second stage of the transconductance amplifier, and a coefficient $\alpha$ may be expressed as follows:

$$a = \frac{1+2g_{m3}R_1}{g_{m3}} \qquad (2)$$

As can be known from the formula (1), a transmission function of the transconductance amplifier has a left half-plane zero point, which may be specifically expressed as follows:

$$z = -\frac{1}{RcCc} \qquad (3)$$

Meanwhile, the transmission function of the transconductance amplifier has two left half-plane zero points, which may be specifically expressed as follows:

$$p1 = -\frac{1}{Cc(a+Rc)} \qquad (4)$$

$$p2 = -\frac{1}{R_L C_L} \quad (5)$$

As can be known from the formula (3) and the formula (5), a left half-plane zero point z and a first non-dominant pole $P_2$ may be canceled out mutually if their values are appropriate, thereby increasing a phase margin for the transconductance amplifier to allow the transconductance amplifier to keep stable. In another aspect, as can be known from the formula (2) and the formula (4), a dominant pole $P_1$ of the transmission function of the transconductance amplifier may also move to a low frequency due to the presence of the coefficient α, and this may likewise result in the reduction of the unity-gain bandwidth of the transconductance amplifier. Meanwhile, the left half-plane zero point and the first non-dominant pole of the transconductance amplifier in fact are not completely canceled out and may keep a certain distance in a frequency domain. A frequency characteristic variation versus the compensating capacitor Cc of the passive frequency compensation technology for the transconductance amplifier as shown in FIG. 2 is shown in FIG. 3. As can be seen from an amplitude-frequency characteristic in FIG. 3, the −3 dB bandwidth in the amplitude-frequency characteristic is somewhat reduced with the increase in the compensating capacitor Cc, which indicates that the dominant pole of the transmission function of the transconductance amplifier is somewhat reduced; and as can be seen from the phase-frequency characteristic in FIG. 3, there is no significant change in sinking and rising amplitudes of a curve of the phase-frequency characteristic with the increase in the compensating capacitor Cc, which indicates that the left half-plane zero point and the first non-dominant pole move to the low frequency simultaneously. Therefore, a compensation effect achieved with the compensation technology shown by the structure 2 is also limited.

BRIEF SUMMARY OF THE INVENTION

Regarding the technical problems that the compensation methods in the prior art may greatly reduce the unity-gain bandwidth of the transconductance amplifier and the compensation effect is limited, the present invention provides a novel frequency-compensated transconductance amplifier.

To achieve the object above, the present invention employs a technical solution as follows:

A frequency-compensated transconductance amplifier comprises an input stage of the transconductance amplifier, consisting of NMOS transistors M1 and M2, a first-stage active load of the transconductance amplifier, consisting of PMOS transistors M3 and M4, a first-stage tail current source of the transconductance amplifier, consisting of a constant current source Iss, a second-stage input transistor of the transconductance amplifier, consisting of a PMOS transistor M5, a second-stage constant current source of the transconductance amplifier, consisting of an NMOS transistor M6, a load capacitor of the transconductance amplifier, consisting of a capacitor $C_L$, and a frequency compensation network of the transconductance amplifier, formed by sequentially connecting a gain stage GAIN, a compensating resistor Rc and a compensating capacitor Cc in series; wherein grids of the NMOS transistors M1 and M2 are connected with an input signal Vin, sources of the NMOS transistors M1 and M2 are grounded via the constant current source Iss, a drain of the NMOS transistor M1 is connected with one end of the gain stage GAIN, a drain of the PMOS transistor M3 and grids of the PMOS transistors M3 and M4, and a drain of the NMOS transistor M2 is connected with a drain of the PMOS transistor M4 and a grid of the PMOS transistor M5;

sources of the PMOS transistors M3, M4 and M5 are connected with a supply voltage vdd, a drain of the PMOS transistor M5, one end of the compensating capacitor Cc, a drain of the NMOS transistor M6 and one end of the capacitor $C_L$ are interconnected to form a connection node which serves as an output end Vout of the transconductance amplifier, the other end of the capacitor $C_L$ is grounded, a source of the NMOS transistor M6 is grounded, and a grid of the NMOS transistor M6 is connected with a bias voltage Vb.

In the frequency-compensated transconductance amplifier provided by the present invention, the frequency compensation network formed by sequentially connecting the gain stage GAIN, the compensating capacitor Rc and the compensating capacitor Cc in series enables the generation of a left half-plane zero point of a very low frequency, and the left half-plane zero point of the very low frequency enables pole-zero cancellation with a first non-dominant pole of the transconductance amplifier, and compared with the traditional compensation method for the transconductance amplifier, the compensation technology provided by the present invention does not decrease the frequency of the dominant pole; and meanwhile, the generated low-frequency left half-plane zero point and the first non-dominant pole undergo cancellation, which may improve the amplitude-frequency characteristic curve of the transconductance amplifier to allow the curve to rise at a high frequency, thereby greatly increasing the unity-gain bandwidth of the transconductance amplifier and guaranteeing an ideal phase margin while significantly improving a factor of mass for the transconductance amplifier.

Further, the gain stage GAIN comprises an NMOS transistor M7, an NMOS transistor M8, an impedance R1 and an impedance R2, wherein a grid of the NMOS transistor M7 is connected with the drain of the NMOS transistor M1, the drain of the PMOS transistor M3, and the grids of the PMOS transistors M3 and M4, a drain of the NMOS transistor M7 is connected with a grid of the NMOS transistor M8 and one end of the impedance R1, sources of the NMOS transistors M7 and M8 are grounded, a drain of the NMOS transistor M8 is connected with one end of the compensating resistor Rc and one end of the impedance R2, and the other ends of the impedance R1 and R2 are connected with the supply voltage vdd.

Further, the impedances R1 and R2 consist of active devices or passive devices.

Further, the gain stage GAIN comprises a PMOS transistor M9, an NMOS transistor M10, an impedance R3 and an impedance R4, wherein a grid of the PMOS transistor M9 is connected with the drain of the NMOS transistor M1, the drain of the PMOS transistor M3, and the grids of the PMOS transistors M3 and M4, a drain of the PMOS transistor M9 is connected with a grid of the NMOS transistor M10 and one end of the impedance R3, the other end of the impedance R3 and a source of the NMOS transistor M10 are grounded, a drain of the NMOS transistor M10 is connected with one end of the compensating resistor Rc and one end of the impedance R4, and a source of the PMOS transistor M9 and the other end of the impedance R4 are connected with the supply voltage vdd.

Further, the impedances R3 and R4 consist of active devices or passive devices.

Further, the gain stage GAIN has a gain with a magnitude of 40 dB to 60 dB.

DETAILED DESCRIPTION OF THE PRESENT INVENTION

For a better understanding of the implemented technical means, inventive features, and achieved objects and effects of the present invention, the present invention will be further illustrated below in combination with specific drawings.

Figure 4:
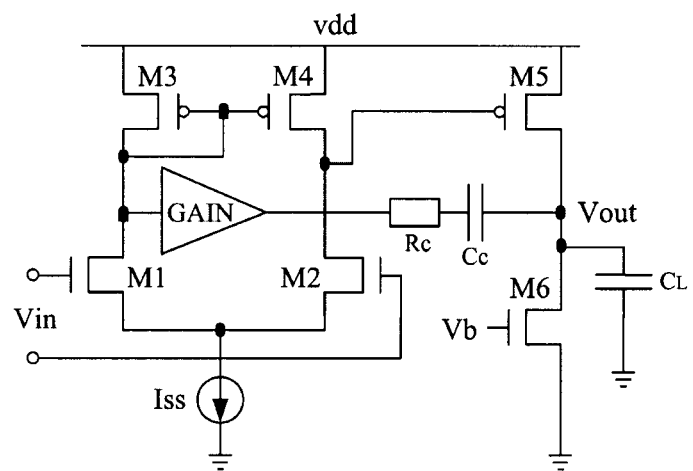
FIG. 4 is a principle diagram of a frequency compensation technology for the transconductance amplifier provided by the present invention.

Referring to FIG. 4, the present invention provides a frequency-compensated transconductance amplifier. The frequency-compensated transconductance amplifier includes an input stage of the transconductance amplifier, a first-stage active load of the transconductance amplifier, a first-stage tail current source of the transconductance amplifier, a second-stage input transistor of the transconductance amplifier, a load capacitor of the transconductance amplifier, and a frequency compensation network of the transconductance amplifier. The input stage of the transconductance amplifier is consisting of NMOS transistors M1 and M2. The first-stage active load of the transconductance amplifier is consisting of PMOS transistors M3 and M4. The first-stage tail current source of the transconductance amplifier is consisting of a constant current source Iss. The second-stage input transistor of the transconductance amplifier is consisting of a PMOS transistor M5. The second-stage constant current source of the transconductance amplifier is consisting of an NMOS transistor M6. The load capacitor of the transconductance amplifier is consisting of a capacitor $C_L$. The frequency compensation network of the transconductance amplifier is formed by sequentially connecting a gain stage GAIN, a compensating resistor Rc and a compensating capacitor Cc in series.

Gates of the NMOS transistors M1 and M2 are connected with an input signal Vin. Sources of the NMOS transistors M1 and M2 are grounded via the constant current source Iss. A drain of the NMOS transistor M1 is connected with one end of the gain stage GAIN, a drain of the PMOS transistor M3 and gates of the PMOS transistors M3 and M4. A drain of the NMOS transistor M2 is connected with a drain of the PMOS transistor M4 and a gate of the PMOS transistor M5;

Sources of the PMOS transistors M3, M4 and M5 are connected with a supply voltage vdd. A drain of the PMOS transistor M5, one end of the compensating capacitor Cc, a drain of the NMOS transistor M6 and one end of the capacitor $C_L$ are interconnected to form a connection node which serves as an output end Vout of the transconductance amplifier. The other end of the capacitor $C_L$ is grounded. A source of the NMOS transistor M6 is grounded. A gate of the NMOS transistor M6 is connected with a bias voltage Vb.

In the frequency-compensated transconductance amplifier provided by the present invention, the frequency compensation network is formed by sequentially connecting the gain stage GAIN, the compensating capacitor Rc, and the compensating capacitor Cc in series enables the generation of a left half-plane zero point of a very low frequency. The left half-plane zero point of the very low frequency enables pole-zero cancellation with a first non-dominant pole of the transconductance amplifier, and compared with the traditional compensation method for the transconductance amplifier. The compensation technology provided by the present invention does not decrease the frequency of the dominant pole. Meanwhile, the generated low-frequency left half-plane zero point and the first non-dominant pole undergo cancellation, which may improve the amplitude-frequency characteristic curve of the transconductance amplifier to allow the curve to rise at a high frequency, thereby greatly increasing the unity-gain bandwidth of the transconductance amplifier and guaranteeing an ideal phase margin while significantly improving a factor of mass for the transconductance amplifier.

Figure 5:
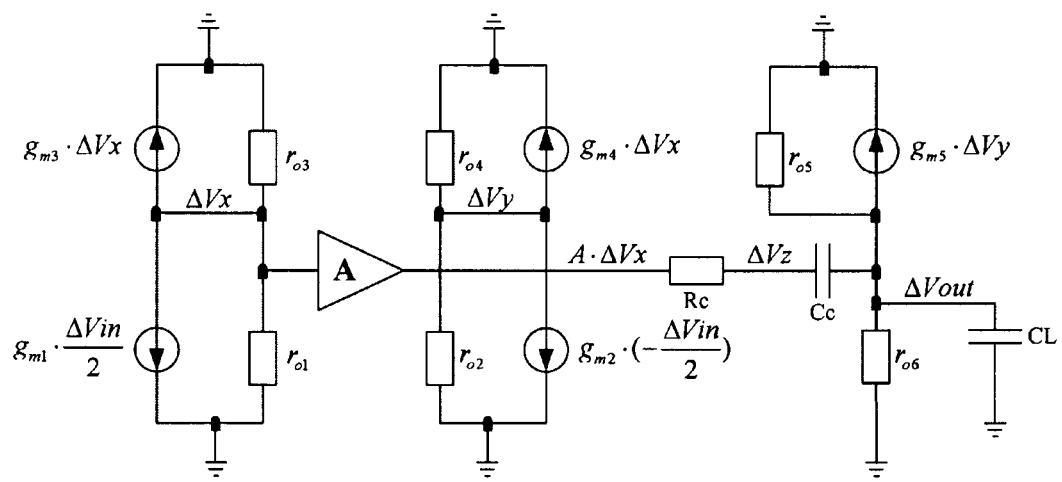
FIG. 5 is a schematic diagram of a small-signal equivalent principle of the frequency compensation technology for the transconductance amplifier provided by the present invention.

As a particular embodiment, the small-signal equivalent principle diagram in the principle diagram as shown in FIG. 4 is as shown in FIG. 5, and for the schematic diagram of the small-signal equivalent principle as shown in FIG. 5, Kirchhoff's Current Law (KCL) is applied to enable the listing of four node equations as follows:

$$g_{m1}\frac{Vin}{2} + \frac{\Delta Vx}{r_{o1}} + g_{m3}\Delta Vx + \frac{\Delta Vx}{r_{o3}} = 0 \quad (6)$$

$$g_{m2}\left(-\frac{Vin}{2}\right) + \frac{\Delta Vy}{r_{o2}} + g_{m4}\Delta Vx + \frac{\Delta Vy}{r_{o4}} = 0 \quad (7)$$

$$g_{m5}\Delta Vy + \frac{Vout}{r_{o5}} + \frac{Vout}{r_{o6}} + sVoutC_L + s(Vout - Vz)Cc = 0 \quad (8)$$

$$\frac{Vz - A\Delta Vx}{Rc} + s(Vz - Vout)Cc = 0 \quad (9)$$

Assuming $r_{o1}=r_{o2}=r_{o3}=r_{o4}=r_{o5}=r_{o6}=r_o$, $g_{m1}=g_{m2}$, $g_{m3}=g_{m4}$, the transmission function of the transconductance amplifier is possibly obtained as follows by solving the equation set above:

$$\frac{Vout}{Vin} = -\frac{0.5g_{m1}g_{m5}r_o + \frac{g_{m1}g_{m3}g_{m5}r_o}{1/r_o + 0.5g_{m3}} + \frac{sCc}{1+sRcCc} \cdot \frac{Ag_{m1}}{2/r_o + g_{m3}}}{2/r_o + s(C_L + Cc) + \frac{s^2Cc^2Rc}{1+sRcCc}} \quad (10)$$

As can be known from the formula (10), the transmission function has a left half-plane zero point, which may be expressed as follows:

$$z = -\frac{0.5g_{m1}g_{m5}r_o + \frac{g_{m1}g_{m3}g_{m5}r_o}{1/r_o + 0.5g_{m3}}}{0.5g_{m1}g_{m5}r_oR_cC_c + \frac{g_{m1}g_{m3}g_{m5}r_oR_cC_c}{1/r_o + 0.5g_{m3}} + \frac{Ag_{m1}C_c}{2/r_o + g_{m3}}} \quad (11)$$

Figure 1:
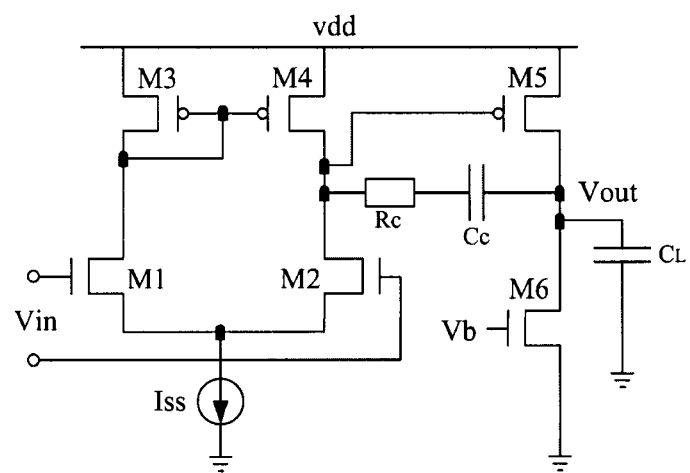
FIG. 1 is a principle diagram of a traditional RC compensation technology for a transconductance amplifier.
Figure 2:
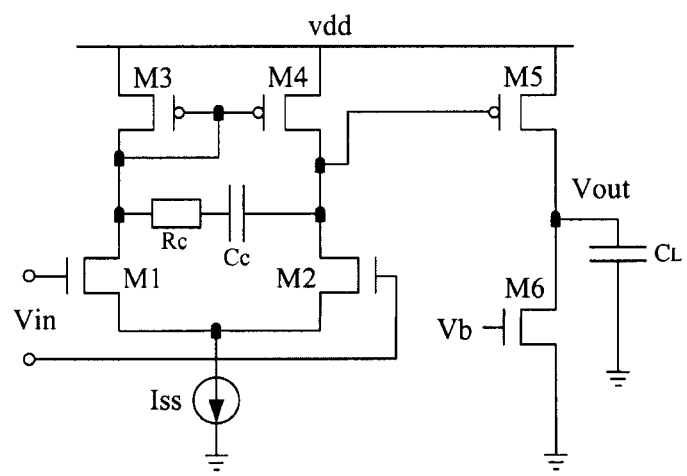
FIG. 2 is a principle diagram of a passive frequency compensation technology for the transconductance amplifier.
Figure 3:
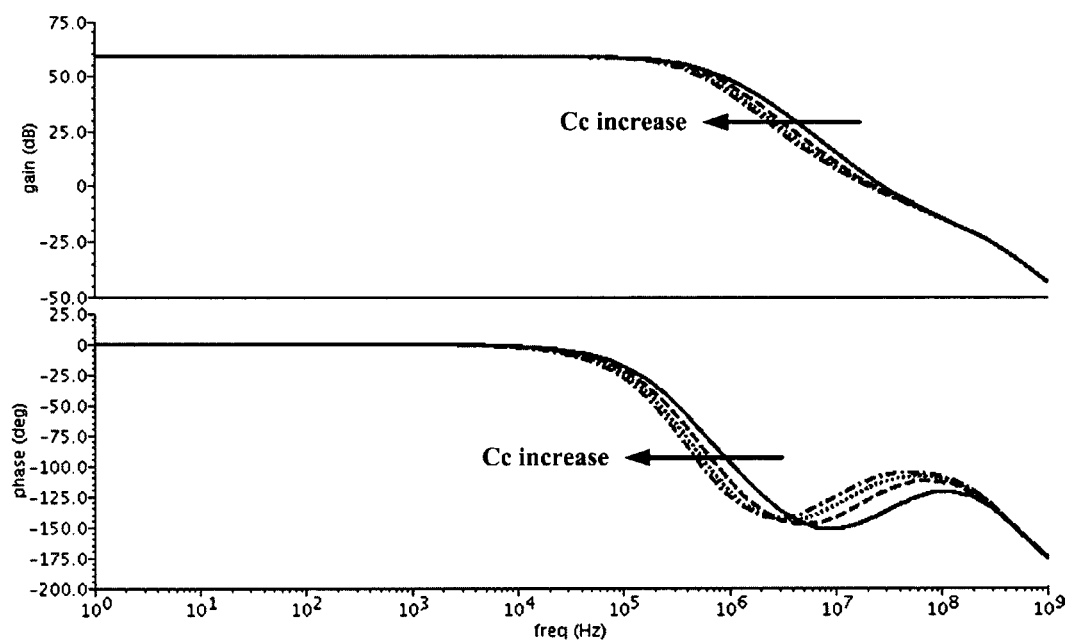
FIG. 3 is a schematic diagram of a frequency characteristic variation versus a compensating capacitor Cc of the passive frequency compensation technology for the transconductance amplifier.
Figure 6:
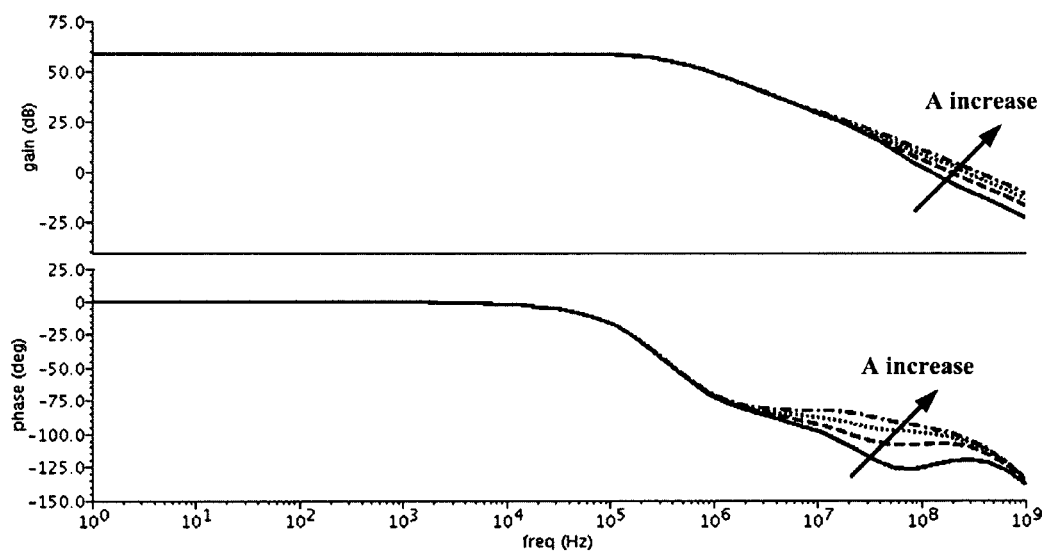
FIG. 6 is a schematic diagram of a frequency characteristic variation versus a gain A of a gain stage GAIN of the frequency compensation technology for the transconductance amplifier provided by the present invention.
Figure 7:
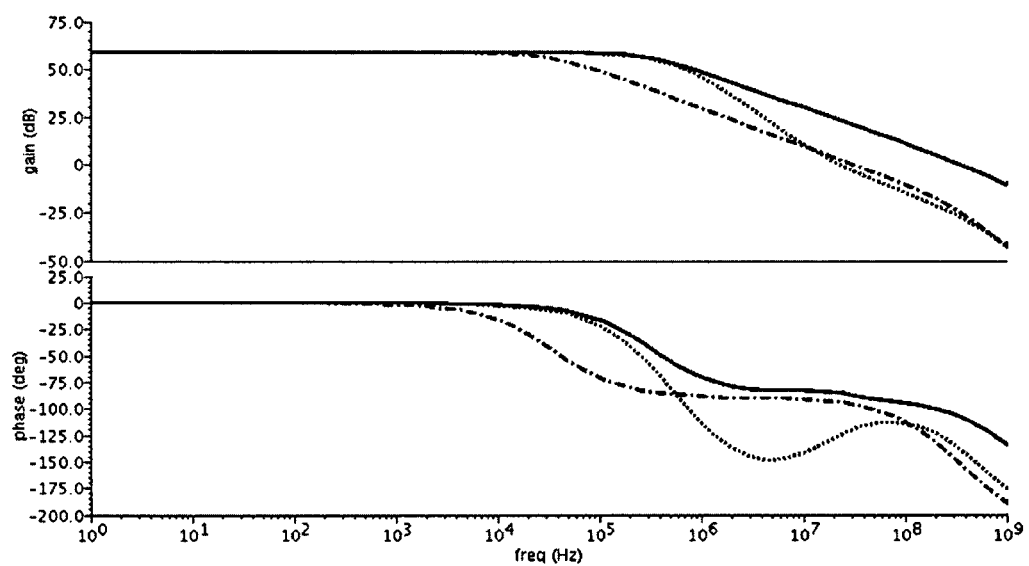
FIG. 7 is a schematic diagram of a frequency characteristic comparison of three compensation technologies in FIG. 1, FIG. 2, and FIG. 4.

As can be known from the formula (11), with the increase of a gain A of the gain stage GAIN in the compensation network, the left half-plane zero point z above moves to a low frequency, and the magnitudes of the two poles of the transmission function are irrelevant to the magnitudes of the gain A of the gain stage GAIN in the compensation network. Therefore, the left half-plane zero point in the transmission function and the first non-dominant pole may be made canceled out by adjusting the magnitude of the gain A of the gain stage GAIN in the compensation network. Meanwhile, based on studies, it has also been found that the dominant pole of the transmission function does not decrease with the increase of the gain A of the gain stage GAIN, and the −3 dB bandwidth does not change. The frequency characteristic variation versus the gain A of the gain stage GAIN of the transconductance amplifier provided by the present invention is as shown in FIG. 6. As can be seen from the amplitude-frequency characteristic in FIG. 6, with the increase of the gain A of the gain stage GAIN, the −3 dB bandwidth of the amplitude-frequency characteristic does not change, which indicates that the dominant pole of the transmission function of the transconductance amplifier does not decrease with the increase of the gain A of the gain stage GAIN. As can be seen from the phase-frequency characteristic in FIG. 6, with the increase of the gain A of the gain stage GAIN, the sink and the rise of the curve of the phase-frequency characteristic are canceled out so that the curve tends to be flat gradually, which indicates that the left half-plane zero point gradually moves to the low frequency to be canceled out with the first non-dominant pole thereby, and this also causes the amplitude-frequency characteristic curve in FIG. 6 to rise upwards at the high frequency, thereby greatly increasing the unity-gain bandwidth of the transconductance amplifier and keeping a better phase margin. With a 0.18 µm CMOS process, the three structures shown in FIG. 1, FIG. 2 and FIG. 4 are designed carefully, the input/output transistors and load transistors in the same size are employed for the three structures, with all the compensating resistors Rc of 5 Kohm, all the compensating capacitors Cc of 2 pF, all the load capacitors of 15 pF, and all the supply voltages vdd of 1.8V, the gain A of the gain stage GAIN in the structure of the present invention is of 40 dB, and the according frequency characteristics of the three structures are as shown in FIG. 7. Thereinto, a solid line represents the frequency characteristic of the present invention, a dashed line represents a frequency characteristic of the structure in FIG. 2, and a center line represents the frequency characteristic of the structure in FIG. 1. As can be seen from FIG. 7, the unity-gain bandwidth of the present invention is greatly improved compared with the structures shown in FIG. 1 and FIG. 2. Meanwhile, the phase margin is also ideal.

Figure 8:
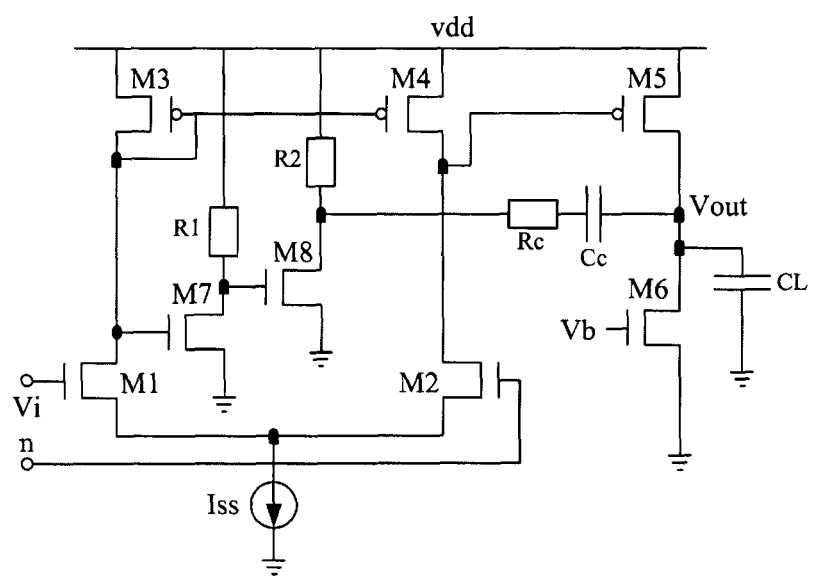
FIG. 8 is a principle diagram of a particular embodiment provided by the present invention.

As one particular embodiment, referring to FIG. 8, the gain stage GAIN includes an NMOS transistor M7, an NMOS transistor M8, an impedance R1, and an impedance R2. A gate of the NMOS transistor M7 is connected with the drain of the NMOS transistor M1. The drain of the PMOS transistor M3, and the gates of the PMOS transistors M3 and M4, a drain of the NMOS transistor M7 are connected with a gate of the NMOS transistor M8 and one end of the impedance R1. Sources of the NMOS transistors M7 and M8 are grounded. A drain of the NMOS transistor M8 is connected with one end of the compensating resistor Rc and one end of the impedance R2. The other ends of the impedance R1 and R2 are connected with the supply voltage vdd. Specifically, the impedances R1 and R2 may consist of either active devices or passive devices, intending to provide a larger small-signal resistance to generate a larger small-signal gain. In the present embodiment, two cascade source amplifiers consisting of the NMOS transistor M7, the NMOS transistor M8, the impedance R1 and the impedance R2 are used to implement the gain stage, and a small positive small-signal gain is generated through the two cascade source amplifiers to thereby achieve the compensation effect as mentioned in the analysis above.

Figure 9:
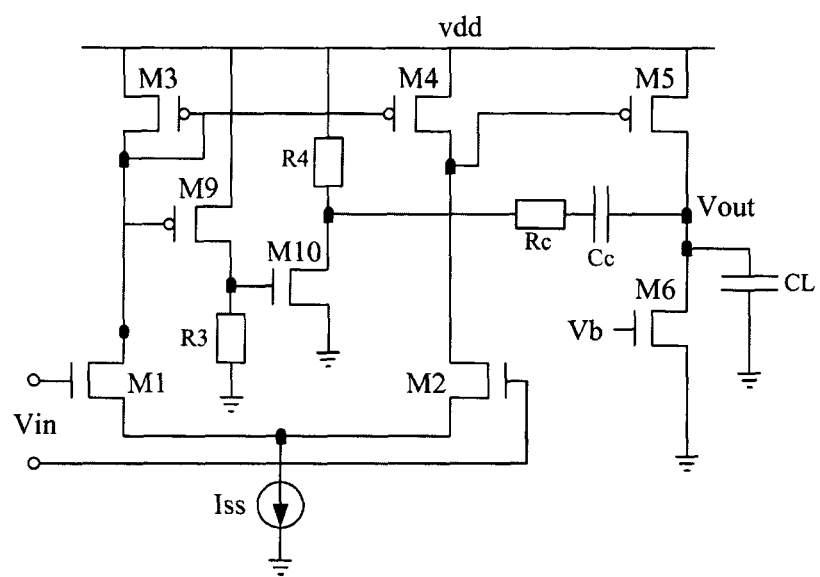
FIG. 9 is a principle diagram of another particular embodiment provided by the present invention.

As another particular embodiment, referring to FIG. 9, the gain stage GAIN includes a PMOS transistor M9, an NMOS transistor M10, an impedance R3, and an impedance R4. A gate of the PMOS transistor M9 is connected with the drain of the NMOS transistor M1. The drain of the PMOS transistor M3 and the gates of the PMOS transistors M3 and M4, a drain of the PMOS transistor M9 are connected with a gate of the NMOS transistor M10 and one end of the impedance R3. The other end of the impedance R3 and a source of the NMOS transistor M10 are grounded. A drain of the NMOS transistor M10 is connected with one end of the compensating resistor Rc and one end of the impedance R4. A source of the PMOS transistor M9 and the other end of the impedance R4 are connected with the supply voltage vdd. Specifically, the impedances R3 and R4 may consist of either active devices or passive devices, intending to provide a larger small-signal resistance to generate a larger small-signal gain. In the present embodiment, two cascade source amplifiers consisting of the PMOS transistor M9, the NMOS transistor M10, the impedance R3 and the impedance R4 are used to implement the gain stage, and a small positive small-signal gain is generated through the two cascade source amplifiers to achieve the compensation effect as mentioned in the analysis above.

It is particularly noted that in the frequency compensation network provided by the present invention, the structural implementation of the gain stage GAIN is not limited to the two particular embodiments above, those skilled in the art may also employ other structures for implementation on the basis of the forgoing detailed implementations, and any embodiment capable of providing a true gain structure may act as the particular embodiment of the gain stage GAIN in the frequency compensation network. As a preferred embodiment, the gain A of the gain stage GAIN has a magnitude of 40 dB to 60 dB. If the magnitude of the gain A is too small, a compensation effect may be insignificant. If the magnitude of the gain A is too large, a derivation deviation of the forgoing formulae may be larger.

According to the frequency compensation technology specific to the transconductance amplifier provided by the present invention, the gain A of the gain stage GAIN is reasonably designed by introducing the frequency compensation network formed by sequentially connecting the gain stage GAIN, the compensating resistor Rc and the compensating capacitor Cc without decreasing the dominant pole of the transmission function of the transconductance amplifier. Thus, the transconductance amplifier can be ensured to have a larger unity-gain bandwidth. Moreover, the left half-plane zero point of the transmission function of the transconductance amplifier is independently adjusted by reasonably designing the gain A of the gain stage GAIN, and the first non-dominant pole of the transmission function of the transconductance amplifier does not change. Thereby better facilitating the implementation of the mutual pole-zero cancellation. Meanwhile, the pole-zero cancellation of the transmission function of the transconductance amplifier may improve the amplitude-frequency characteristic curve of the transconductance amplifier to allow a rise at a high frequency. Thereby greatly increasing the unity-gain bandwidth of the transconductance amplifier and keeping a better phase margin.

The foregoing merely provides the embodiments of the present invention, but is not intended to thereby limit the patent scope of the present invention. Any equivalent structures made by utilizing the specification and the accompanying drawings of the present invention and applied to other relevant technical fields directly or indirectly may likewise fall under the scope of patent protection of the present invention.

What is claimed is:

1. A frequency-compensation transconductance amplifier, comprising: an input stage consisting of NMOS transistors M1 and M2, a first-stage active load consisting of PMOS transistors M3 and M4, a first-stage tail current source consisting of a constant current source Iss, a second-stage input transistor consisting of a PMOS transistor M5, a second-stage constant current source consisting of an NMOS transistor M6, a load capacitor consisting of a capacitor $C_L$, and a frequency compensation network where a gain stage GAIN, a compensating resistor Rc and a compensating capacitor Cc are connected in series; wherein
gates of the NMOS transistors M1 and M2 are connected to an input signal Vin, sources of the NMOS transistors M1 and M2 are grounded through a constant current source Iss, a drain of the NMOS transistor M1 is connected to one end of the gain stage GAIN, a drain of the PMOS transistor M3 and gates of the PMOS transistors M3 and M4, a drain of the NMOS transistor M2 is connected to a drain of the PMOS transistor M4 and a gate of the PMOS transistor M5;
sources of the PMOS transistors M3, M4 and M5 are connected to a supply voltage vdd, a drain of the PMOS transistor M5, one end of a compensation capacitor Cc, a drain of the NMOS transistor M6 and one end of a capacitor $C_L$ are connected to one node which is an output end Vout of the transconductance amplifier, other end of the capacitor $C_L$ is grounded, a source of the NMOS transistor M6 is grounded, and a gate of the NMOS transistor M6 is connected to a bias voltage Vb;
wherein the gain stage GAIN comprises an NMOS transistor M7, an NMOS transistor M8, an impedance R1, and an impedance R2, wherein a gate of the NMOS transistor M7 is connected with the drain of the NMOS transistor M1, the drain of the PMOS transistor M3, and the gates of the PMOS transistors M3 and M4, a drain of the NMOS transistor M7 is connected with a gate of the NMOS transistor M8 and one end of the impedance R1, sources of the NMOS transistors M7 and M8 are grounded, a drain of the NMOS transistor M8 is connected to one end of the compensating resistor Rc and one end of the impedance R2, and other ends of the impedance R1 and R2 are connected to a supply voltage vdd.

2. The frequency-compensated transconductance amplifier according to claim 1, wherein the impedances R1 and R2 consist of active devices or passive devices.

3. The frequency-compensated transconductance amplifier according to claim 1, wherein the gain stage GAIN comprises a PMOS transistor M9, an NMOS transistor M10, an impedance R3, and an impedance R4, wherein a gate of the PMOS transistor M9 is connected with the drain of the NMOS transistor M1, the drain of the PMOS transistor M3, and the gates of the PMOS transistors M3 and M4, a drain of the PMOS transistor M9 is connected with a gate of the NMOS transistor M10 and one end of the impedance R3, other end of the impedance R3 and a source of the NMOS transistor M10 are grounded, a drain of the NMOS transistor M10 is connected to one end of the compensating resistor Rc and one end of the impedance R4, and a source of the PMOS transistor M9 and other end of the impedance R4 are connected to the supply voltage vdd.

4. The frequency-compensated transconductance amplifier according to claim 3, wherein the impedances R3 and R4 consist of active devices or passive devices.

5. The frequency-compensated transconductance amplifier according to claim 1, wherein the gain stage GAIN features the gain of a magnitude from 40 dB to 60 dB.

6. A frequency-compensation transconductance amplifier, comprising: an input stage consisting of NMOS transistors M1 and M2, a first-stage active load consisting of PMOS transistors M3 and M4, a first-stage tail current source consisting of a constant current source Iss, a second-stage input transistor consisting of a PMOS transistor M5, a second-stage constant current source consisting of an NMOS transistor M6, a load capacitor consisting of a capacitor $C_L$, and a frequency compensation network where a gain stage GAIN, a compensating resistor Rc and a compensating capacitor Cc are connected in series; wherein
gates of the NMOS transistors M1 and M2 are connected to an input signal Vin, sources of the NMOS transistors M1 and M2 are grounded through a constant current source Iss, a drain of the NMOS transistor M1 is connected to one end of the gain stage GAIN, a drain of the PMOS transistor M3 and gates of the PMOS transistors M3 and M4, a drain of the NMOS transistor M2 is connected to a drain of the PMOS transistor M4 and a gate of the PMOS transistor M5;
sources of the PMOS transistors M3, M4 and M5 are connected to a supply voltage vdd, a drain of the PMOS transistor M5, one end of a compensation capacitor Cc, a drain of the NMOS transistor M6 and one end of a capacitor $C_L$ are connected to one node which is an output end Vout of the transconductance amplifier, other end of the capacitor $C_L$ is grounded, a source of the NMOS transistor M6 is grounded, and a gate of the NMOS transistor M6 is connected to a bias voltage Vb;
wherein the gain stage GAIN comprises a PMOS transistor M9, an NMOS transistor M10, an impedance R3, and an impedance R4, wherein a gate of the PMOS transistor M9 is connected with the drain of the NMOS transistor M1, the drain of the PMOS transistor M3, and the gates of the PMOS transistors M3 and M4, a drain of the PMOS transistor M9 is connected with a gate of the NMOS transistor M10 and one end of the impedance R3, other end of the impedance R3 and a source of the NMOS transistor M10 are grounded, a drain of the NMOS transistor M10 is connected to one end of the compensating resistor Rc and one end of the impedance R4, and a source of the PMOS transistor M9 and other end of the impedance R4 are connected to the supply voltage vdd.

* * * * *